United States Patent [19]

Bond

[11] Patent Number: 5,537,675
[45] Date of Patent: Jul. 16, 1996

[54] SPLATTER CONTROLLING NOISE BLANKER

[76] Inventor: Kevin J. Bond, 10 Kirtain Drive, Croydon, Australia, 3136

[21] Appl. No.: 258,876
[22] Filed: Jun. 13, 1994
[51] Int. Cl.$^6$ ................................................ H04B 1/0
[52] U.S. Cl. ............................ 455/223; 455/296; 375/351
[58] Field of Search ............................ 455/194.1, 219, 455/221, 222, 223, 224, 225, 295, 296, 306, 311; 375/222, 346, 351

[56] References Cited

U.S. PATENT DOCUMENTS

| 4,654,885 | 3/1987 | Meszko et al. | 455/219 |
| 5,170,489 | 12/1992 | Glazebrook | 455/223 |
| 5,212,827 | 5/1993 | Meszko et al. | 455/219 |
| 5,384,805 | 1/1995 | Hawkins et al. | 375/222 |

FOREIGN PATENT DOCUMENTS

0132307A2  6/1984  European Pat. Off. ......... H03G 3/34

Primary Examiner—Reinhard J. Eisenzopf
Assistant Examiner—Thanh Le
Attorney, Agent, or Firm—Juliana Agon

[57] ABSTRACT

A splatter control circuit (28) for a noise blanking receiver (10) includes a SAW filter (40) having an output (115) in a main signal path. A noise blanker (27) having a control input (86) and a signal input (128) connectable to the input of the SAW filter, and an output (58), produces at its output signals received when no noise pulses are detected and the blanker switch blanking the SAW output when a noise pulse is detected. A level detector (80) having an input connected to the output of the SAW filter and an output, the level detector producing a signal at its output to stop the blanker from blanking at its control input when the SAW filter passes a signal above a predetermined level.

12 Claims, 5 Drawing Sheets

SPLATTER CONTROLLING NOISE BLANKER

TECHNICAL FIELD

This invention relates generally to noise blankers and more particularly to those communication devices that employ noise blankers.

BACKGROUND

Those skilled in the art will appreciate the harsh operating environment of communication devices such as mobile radios, especially in a low frequency operating bandwidth. The major contributors to a severely noisy environment for the mobile radio include engine noise, at frequency bands below 174 MHz, (both from the vehicle using the mobile radio and surrounding vehicles), electrical interference from high power lines, and atmospheric disturbances.

Some mobile radios have employed noise blankers to suppress or eliminate these noise effects thereby improving system coverage, especially in weak signal areas. The basic purpose of a noise blanker is to detect the presence of impulse-type noise and momentarily prevent the noise in the recovered signal from reaching the intermediate frequency (IF) stage. Thus, for the noise blanker to function properly, it must detect the presence of noise and inhibit the signal path in the main receiver before the noise gets to the point where it is unwanted (to be stopped.) Hence, noise blankers require a delay in the signal path to allow time for any ignition or other noise pulses to be processed and gated off before they reach the crystal filters in the IF stage where the noise pulse will be stretched in time due to ringing in the highly selective crystal filters.

Historically, implementation of a noise blanker in a mobile receiver was facilitated by the commensurate bandwidth of the main receiver and the noise blanker (i.e. each about one Megahertz) such that a "race" condition was not a significant problem. Since the bandwidths were practically the same, the delay was effectively the same or could be compensated for by small "lump element" filters.

Modern mobile radios however, have extremely broad bandwidths. Since most mobile radios have frequency synthesizers that can generate a wide variety of frequencies, mobile radios today use broad bandwidth filters permitting the mobile radio user to operate over a wide band of frequencies. Thus it is common for a receiver to have a bandwidth of twenty or thirty megahertz. However, this bandwidth extension creates significant problems in the operation of the noise blanker circuitry. Since the bandwidth of the main receiver may be twenty times the bandwidth of the noise blanker (thus making the noise blanker delay twenty times that of the main receiver) control pulses cannot reach the blanker switch in time to prevent the noise from entering the receiver IF. A large "lump-element" filter would have to be used to compensate for a delay of this magnitude. However, since the current trend is toward radio size reduction, the size of such a filter would be prohibitive.

Tuned circuits have also been used to provide this delay, but the manufacturing labor used to tune such a circuit would also make such a filter less advantageous.

Moreover, the bandwidth of the noise blanker cannot be extended to be comparable to the bandwidth of the main receiver because much more other carriers or strong information signals may be interpreted as noise and would "blank" the receiver. Overall, the effect of such a noise blanker bandwidth extension would be that the main receiver would be inhibited most of the time.

A solution to the delay problem was achieved using a surface acoustic wave (SAW) filter to afford both selectivity and time delay in an appropriately sized filter as disclosed in U.S. Pat. No. 4,654,885, titled "Mobile Radio Range Extender with Saw Filter." The SAW filter can provide a sufficient delay, does not cause significant pulse stretching, and provides a narrow IF bandwidth.

Such a SAW filter can blank certain off or adjacent carriers (carriers having frequencies close to the desired carrier frequency) but the SAW filter alone will not prevent splatter from these off-channel carriers. In the presence of ignition noise then, splatter is caused by any strong signal components passing through the SAW filter and arriving at the blanker switch.

Splatter is the generation of on-channel energy created by blanking off-channel carriers. All carriers that fall into the passband of the pre-selector and of whatever other selectivity there is before the blanker switch are switched OFF (or blanked out) by the blanker switch. However, each time blanking pulses occur, a spectrum of side band energy is created from each carrier mixing with the blanking pulses applied to the blanker switch. If these sidebands fall into the IF frequency range they may pass through the radio crystal filter as unwanted signals. Thus, this process of picking up such unwanted signals creates splatter. Hence, splatter depends on the frequency spectrum of the blanking pulses and the amplitude of the off-channel carriers and their frequency separation to the receiver or operating channel. The frequency spectrum of the blanking pulses, in turn, depend on the pulse rate and the pulse shape.

If splatter is not prevented by a splatter control circuit, the receiver sensitivity, as measured by its signal-to-noise ratio, can degrade by up to 50 dB compared to a radio without a noise blanker, or one with the blanker circuitry disabled. Thus a need exists to provide effective splatter control during noise blanking while contemporaneously providing broad receiver bandwidth and radio size reduction.

SUMMARY OF THE INVENTION

Briefly, according to the invention, a splatter control circuit for a noise blanking receiver includes a SAW filter having an output in a main signal path. A noise blanker having a control input and a signal input connectable to the input of the SAW filter, and an output, produces at its output signals received when no noise pulses are detected and the blanker switch blanking the SAW output when a noise pulse is detected. A level detector having an input connected to the output of the SAW filter and an output, the level detector producing a signal at its output to stop the blanker from blanking at its control input when the SAW filter passes a signal above a predetermined level. Therefore, the saw output response signal provide a readily available measure to determine when, and to what extent, the noise blanker operation is required.

DETAILED DESCRIPTION OF THE PREFERRED EMBODIMENT

Figure 1:
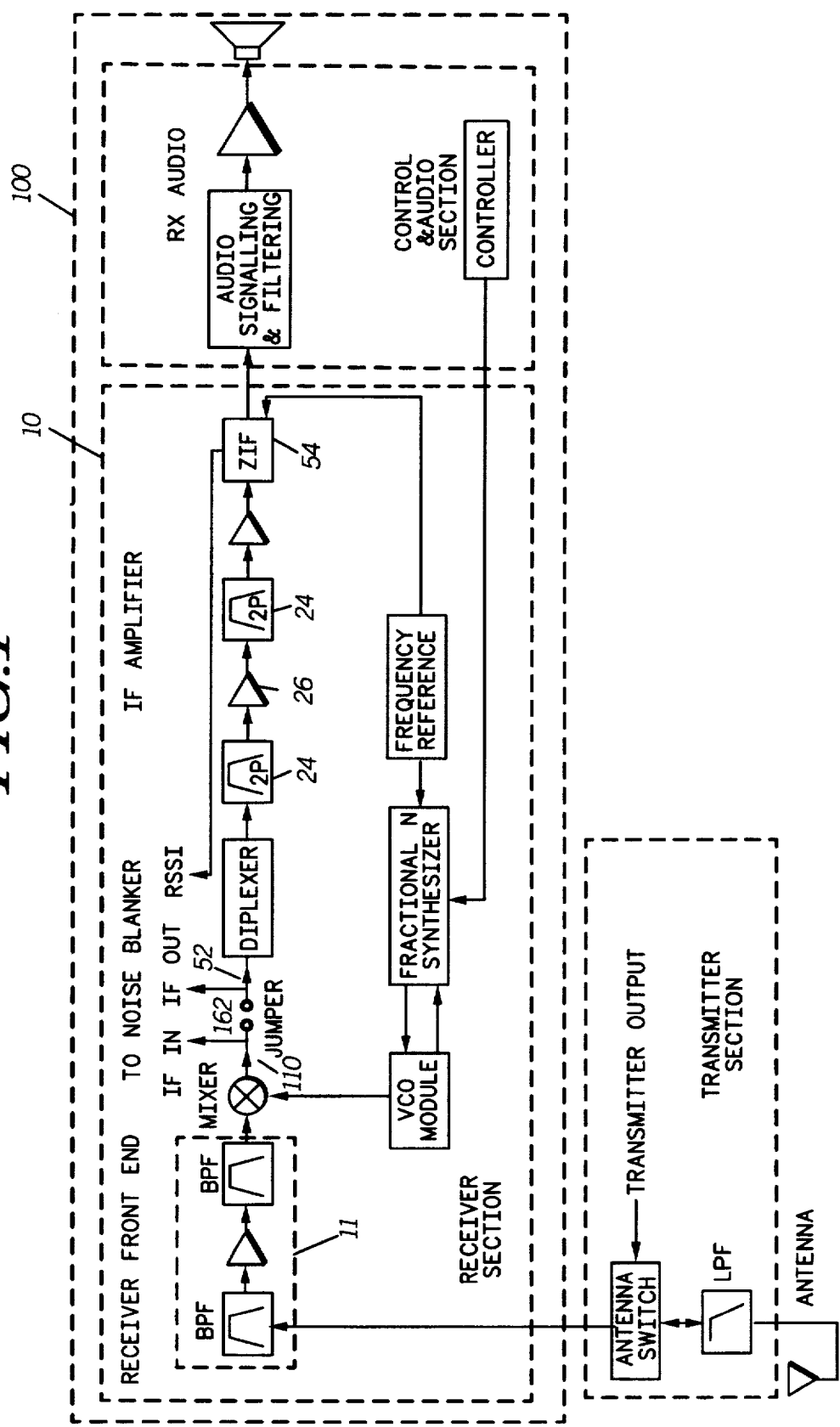
FIG. 1 is a block diagram of a radio employing a noise blanker in accordance with the present invention.
Figure 2:
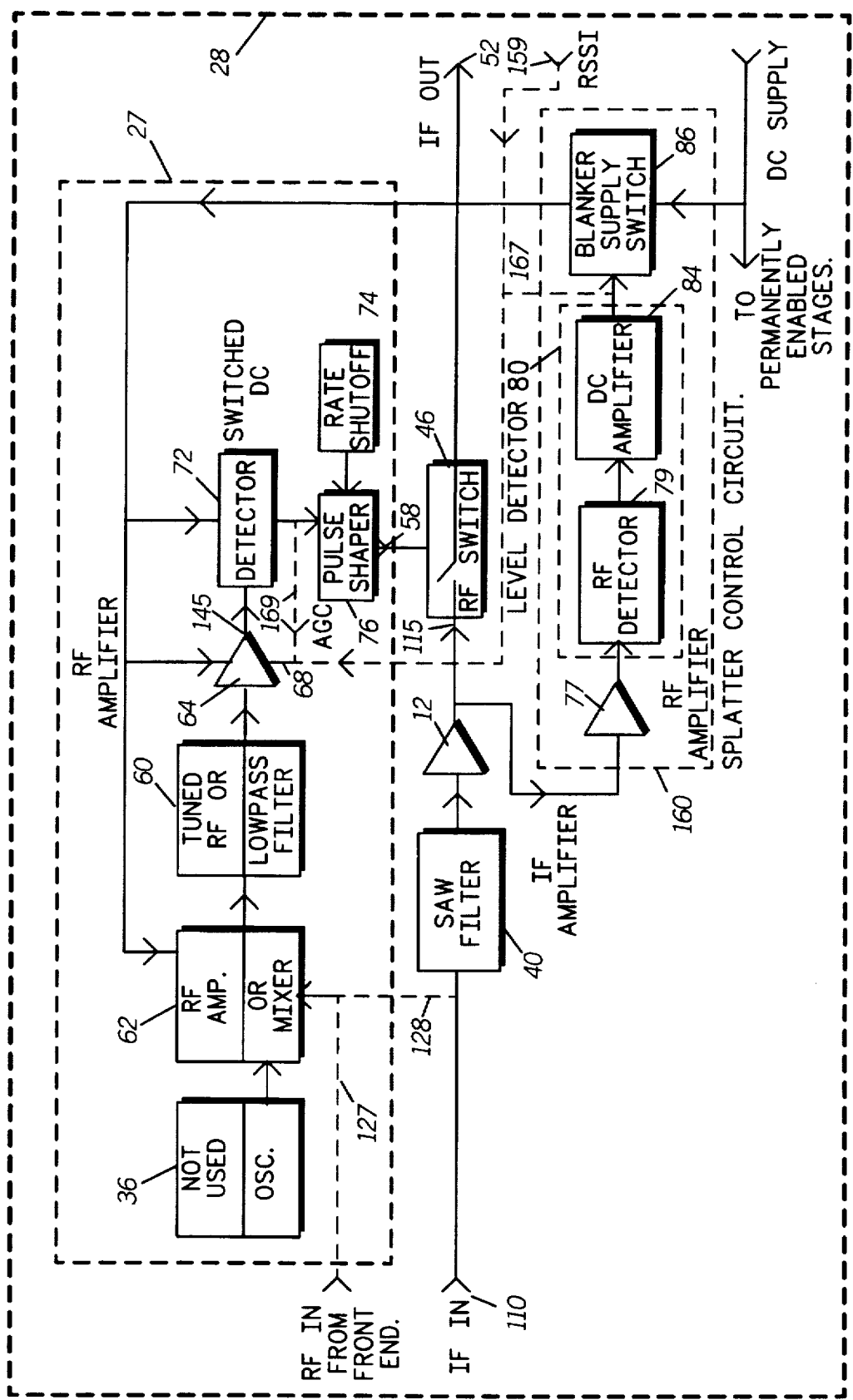
FIG. 2 is a block diagram of the noise blanker module, including noise control in accordance with the present invention.

Referring to FIGS. 1 and 2, a noise blanker in accordance with the present invention is connectable, as a separate plug-in module 28, to a portion of an FM communication system 100, as seen in FIG. 1. The communication system 100 of FIG. 1 has a main receiver 10 which includes a broadband front-end or pre-selector 11 before a mixer and an IF section after the mixer. The communication system 100 may be used in radio communication units, such as mobile two-way transceivers.

With a jumper 162 taken out between IF signal input and outputs IF IN 110 and IF OUT 52, respectively, the noise blanker module 28 can be inserted into the main IF signal path. At the IF IN of the receiver 10, an intermediate frequency (IF) signal 110, which also serves as a pulse processing input signal 128 and may be at 109.65 MHz (for example), is filtered by a SAW filter 40 and amplified by an IF amplifier 12, to produce an amplified IF signal 115.

The SAW filter 40 time delays the IF signal for approximately one microsecond and provides the major amount of time delay in the main receiver 10. Generally, the main requirements on the SAW filter 40 is that it has an appropriately low insertion loss, for example 8.5 dB typical. It should be low enough to prevent over attenuation of the desired IF signal which would cause a loss of receiver sensitivity. The exact filter topology of the SAW filter 40 is not critical, however, a narrowband filter topology having a bandwidth in the order of 700 kHz is preferred since the SAW filter 40 may then provide frequency selectivity in addition to time delay in an appropriately sized package.

The IF amplifier 12 in this example has an RF gain such that the signal level at IF OUT 52 is equal to the level at IF IN 110. Having the IF amplifier 12 following the SAW is not essential, but in this example, the amplifier 12 was found to provide optimum receiver intermodulation performance. The input signal 115 from the amplifier 12 is switchably (controlled by an IF signal path blanker RF switch 46) coupled to the rest of the receiver 52 which could be IF bandpass crystal filters 24 and IF amplifiers 26 in the IF out signal path before a zero IF (ZIF) demodulator 54. Two two-pole crystal filters 24 are shown in FIG. 1.

An alternate arrangement is to derive the pulse processing input signal 128 from the front-end 11 via an input 127 separate to the IF IN 110.

Referring to FIG. 2, a noise processing portion 27 of the noise blanker module 28 controls the selective opening and closing of the blanker switch 46 of the main IF signal path while a splatter control circuit or portion of the blanker module 160 automatically controls the activation of the noise processing circuit blanker portion 27.

The noise blanker switch 46 provides the means by which the received signal is interrupted and thus prevented from entering the demodulator 54 or the rest of the receiver 10. The blanker switch 46 may be implemented using any suitable technology and may be, for example, one or more field effect transistors (FET's) configured either in series and/or in shunt (to the main IF signal path) to provide the required attenuation while contemporaneously consuming little printed circuit (PC) board area. When the IF frequency is high, such as in this example (109.65 MHz), a balanced switch is preferably used consisting of two broadband transformers and two pin diodes. This is necessary to achieve high input to output isolation (50 dB typical) and minimal switching insertion noise (ie. transients produced by the actual switching action). Regardless of the actual switch implementation, the blanker switch 46 may be positioned anywhere between the saw filter 40 and the main selectivity of the next section, such as the crystal filters 24 of the IF section.

Normally, the blanker switch 46 is "closed" to couple the output of the amplifier 12 to the input of the second IF section 52 to allow the received signal to be processed by the demodulator 54 and subsequent circuitry.

However, when the noise blanker 28 determines that a noise condition exists, the blanker switch 46 is momentarily "opened" (by asserting a control input signal 58) to prevent the received signal from entering the second IF 52 and being demodulated by the demodulator 54. The "open" duration is appropriately set to prevent the recovered signal containing the noise from entering the rest of the receiver 52, after which the blanker switch 46 "closes" permitting normal operation.

To provide the control signal 58 to control the blanker switch 46, the noise processing portion 27 includes an RF amplifier 62, a filter 60, a high gain AGC controllable amplifier to serve as the pulse processing amplifier 64, a detector 72 and a pulse shaper 76 to form a pulse processing section. This pulse processing section of the blanker is described in more detail in the following paragraphs.

In the preferred embodiment, RF amplifier 62 provides signal gain and isolation between its input 128 and the filter 60.

The filter 60 sets the bandwidth of the noise processing portion 27 and determines the amount of frequency spectrum that the noise processing portion 27 will monitor for noise. Since the bandwidth of the main receiver 10 is so broad (in this example 22 MHz) there may be several mobile radio users transmitting in the allotted spectrum. The noise or pulse processing part 27 of the noise blanker 28 has an RF sampling channel centered at the desired receive IF so the filter preferably implemented as a RF bandpass filter 60 must be as narrow as practical to reject other carriers or information signals since they may be interpreted as noise and the main receiver 10 would be inhibited.

Alternately, if tuned, the RF bandpass filter 60 of the noise processing portion 27 must be set or tuned to monitor a portion of the frequency band that is not being used by other carriers or information signals since they may also be interpreted as noise inhibiting the main receiver. The bandpass filter may be implemented by any topology that facilitates tuning and may be for example, a 3 pole-coupled resonator filter having a one megahertz bandwidth or suitable equivalent.

In an alternate configuration, block 62 can be used as a mixer producing an output frequency equal to the difference between an optional oscillator 36 and the input frequency of the pulse processing input signal 128. This additional mixing allows the filter 60 to operate at a lower frequency where it is easier to obtain a narrower bandwidth with an L-C filter, thereby reducing the possibility of interfering signals degrading blanker operation. If the oscillator 36 is operating at a frequency close to the input frequency of the pulse processing input signal 128, a low-pass filter may be used as the filter block 60.

With either filter embodiments, there is not a race problem due to different main receiver and noise blanker bandwidths. As far as the noise processing portion 27 is concerned, zero time starts at IF IN point 110. Since the SAW filter provides one microsecond delay in the signal path, and the delay in the filter 60 is much less than this, there is no problem getting the start of the blanker pulse to occur before the noise pulse coming out of the SAW filter arrives at the blanker switch 46.

The amplified band-limited signal from filter block 60 is applied to the high gain automatic gain controllable (AGC) amplifier 64 which accepts an AGC input signal at terminal or port 68. The AGC signal applied at port 68 of the amplifier 64 increases or decreases the gain of the amplifier 64 in accordance with well known AGC operation.

The now appropriately amplified noise signal is provided to a pulse detector 72. The pulse detector 72 monitors the amplified band-limited signal and compares it to a predetermined threshold to determine when noise pulses are present. When the noise pulses exceed the predetermined threshold the pulse detectors 72 outputs a pulse indicating that excessive noise is present. Even in the presence of strong signals, the AGC action still allows ignition pulses to be detected because the pulse detector 72 responds to amplitude noise spikes or impulses on the signal envelope of the received signal.

The pulse output from the pulse detector 72 is amplified in an optional separate pulse amplifier (or incorporated in a pulse shaper 76) which provides sufficient gain to the pulse to "trigger" or activate the pulse shaper 76.

The pulse shaper 76 accepts the amplified "trigger" pulse and first generates a substantially rectangular pulse which is then shaped into a trapezoidal shape or any other desirable shape with sloped rising and falling edges and having a predetermined pulse duration. The duration of the pulse or the control signal 58 generated by the pulse shaper 76 is set to allow sufficient time for the blanker switch 46 to reach and maintain maximum attenuation thus preventing the noise signal being delayed by the SAW filter 40 from entering the rest of the receiver 52. Accordingly, the duration of the pulse generated by the pulse shaper 76 may be set to an appropriate duration to allow the blanker switch 46 to reach full attenuation and remain "open" until the noise signal has sufficient time to pass through the SAW filter 40 taking into account the varying parameters. In conjunction with the present example, the rise and fall times of the blanking pulse are also optimized to minimize splatter, with an optimum rise time of 750 nanoseconds and a fall time of four microseconds. An optimum pulse width or pulse duration is preferably set about five microseconds to sufficiently blank the noise signal in the main receiver 10 without substantially impairing the quality of the received signal.

It is usually necessary to include a rate shut-off circuit 74 that prevents the processing portion 27 from being switched at excessively high repetition rates. The most probable cause of high repetition blanking is the heterodyning of two carriers in the sampling channel. The pulses in pulse shaper 76 are integrated in the rate shut-off circuit 74 to produce a DC voltage proportional to the pulse rate. When this voltage reaches a threshold value corresponding to a rate shut-off frequency of about 20 KHz, the blanking pulses to switch the blanker switch 46 are disabled.

As previously mentioned, the amplifier 64, and thus the noise processing portion 27, is controlled by the AGC signal. Generally, an AGC signal is commonly used in AM receivers as a control for amplifiers. Basically, the goal of the AGC circuit is to reduce the gain of the blanker RF channel when the desired signal increases, thereby desensitizing the processing portion 27 and increasing the minimum noise pulse amplitude required to initiate blanking. As the desired signal level increases, the smaller noise pulses, impulses, or spikes no longer create objectionable interference, whereas blanking would create interference.

The AGC signal applied to the pulse processing RF amplifier 64 may be derived from either the detector 72 or a received signal strength indicator (RSSI) 159 from the main radio receiver 10. The actual choice may depend on the proximity and nature of other strong signals occurring in the passband of the tuned RF filter 60 before the RF amplifier 64.

If the AGC is derived from the detector 72, signals in the tuned RF passband will develop a DC voltage on the AGC line proportional to the signal strength 169. This reduces the amplifier gain, preventing overload of the detector 72 and thereby allowing efficient pulse detection over a large range of input signal levels.

In the alternate embodiment of the fixed RF channel being tuned for expected noise in the noise processing portion 27, the desired signal is not present in the fixed RF channel since the tuned RF filters are intentionally tuned to eliminate the desired signal. Therefore, another source of AGC control is needed. Hence, in the main radio receiver 10 (usually from the demodulator 54), an RSSI signal may be utilized to indicate the strength of the signal received. The RSSI is a DC voltage which varies proportionally to the signal strength of the received signal including noise. Hence, if the AGC is derived from the RSSI 159, only on-channel signals, i.e., those within the main receiver passband (24), will control the RF amplifier gain. When the on-channel signal is sufficiently large enough that ignition and other interference is no longer degrading the received signal quality, the AGC reduces the gain to the point where blanking pulses are not generated. Thus, the AGC signal can be developed from the RSSI 159 which is applied to the AGC port 68 of the amplifier 64 to control the gain in well known AGC operation.

In accordance with the present invention, the amplified SAW filter signal at the output of amplifier 12 is then processed by the splatter control circuit 160. The splatter control circuit 160 basically includes an RF amplifier 77 and a splatter detector in the form of a level detector 80. At high signal levels, an RF detector 79 of the splatter or level detector 80 generates a DC voltage proportional to the signal level at the output of the SAW filter 40. This DC voltage is further amplified by a DC amplifier 84 of the splatter detector 80.

The constant amplitude threshold of the level detector 80 is set at a predetermined level to turn the noise processing portion 27 of the blanker OFF for switching OFF the blanking pulses and closing the IF signal path (46) when a signal at the SAW output is of sufficient amplitude to cause splatter. The output of the DC amplifier 84 controls a blanker supply switch 86, so that blanking pulses are not produced when the signal level at the SAW 40 is at the level where having the noise processing portion of the blanker 27 ON would degrade the receiver recovered audio.

As described earlier, when ignition noise is present, splatter is caused by any strong signal components passing through the SAW filter and arriving at the blanker switch. Therefore, if the signal level at the output of the SAW 40 is detected by the received signal level detector 79, the detected output may be used as the criterion for controlling the de-activation of the blanking pulses.

Figure 3:
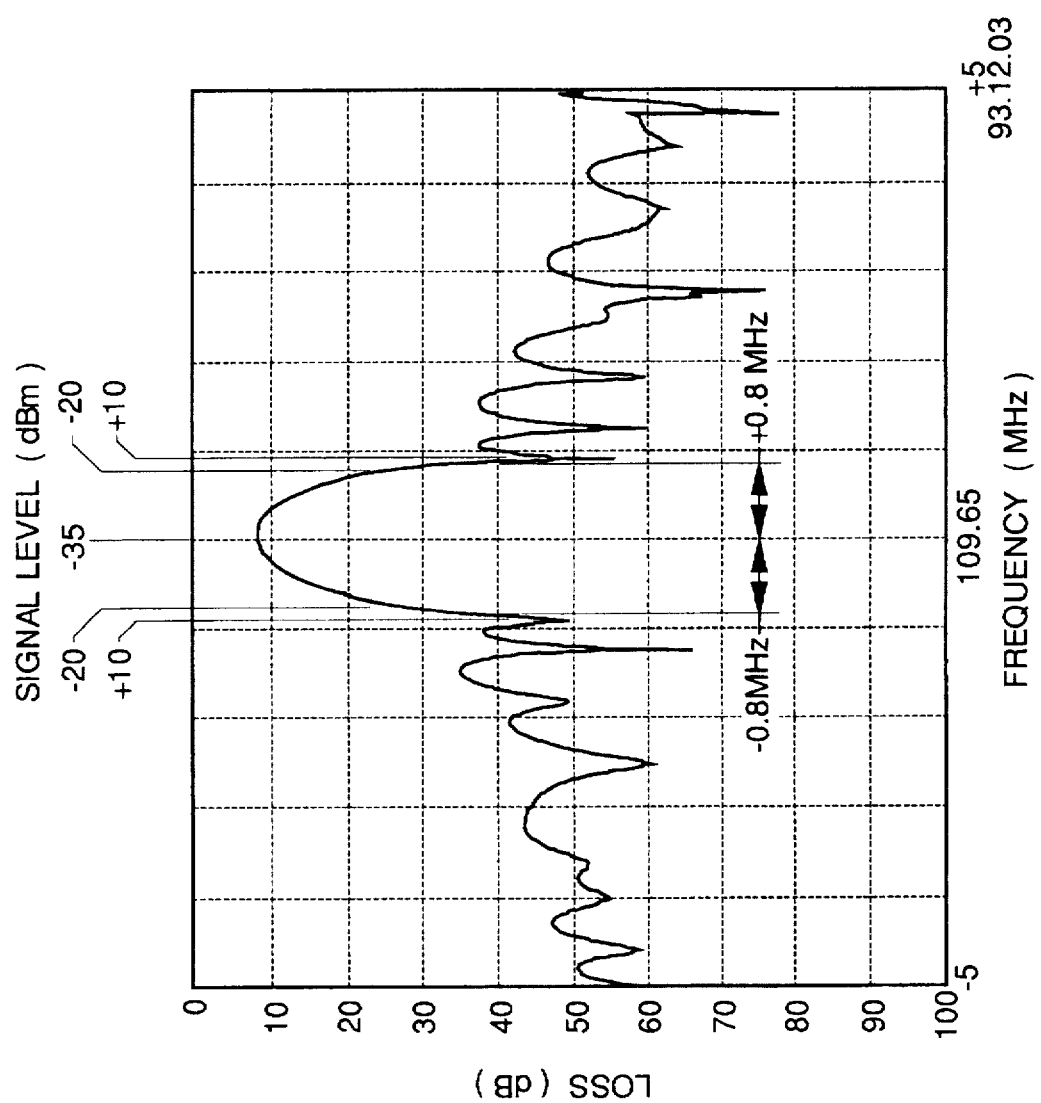
FIG. 3 is a graphical representation of the frequency representation of the frequency response plots of the SAW filter used in accordance with the present invention.

The detector 79 is structured in such a way that the signal level SIG. LEVEL versus frequency required to shut off the blanking pulses follows an inverted version of the frequency plot for the SAW filter 40 as seen in FIG. 3. In other words, the further off-centered the unwanted signal is, the greater the input signal level (at the antenna, or the SAW input) that is required to reach the output threshold level in order to shut off the noise processing portion 27. This amplitude frequency relationship exists because the further down the selectivity skirt or SAW roll-off of the SAW frequency response curve the signal is, the greater its level must be at the input to the detector 79 to reach the threshold of the blanker switch 86. The frequency response plots for the SAW filter used in this example are shown in FIG. 3.

Accordingly, the processing portion 27 is turned OFF when a strong interfering signal is causing splatter. The amount of gain provided by the amplifier 77 should be set such that the blanker pulses are disabled for interfering signals which would cause the recovered audio signal plus noise and distortion (SINAD) to be worse than with no blanker.

The threshold of the blanker supply switch 86 is therefore set such that the blanker is still operational for splatter situations which are not severe enough to prevent the blanker, when enabled, from giving an improvement in received signal quality. Conversely, the blanker is disabled in splatter situations where, otherwise having the blanker ON, would cause a degradation of receive signal quality.

In general, the control signal applied to the switch 86 is generally a logic signal which may be generated by combinational logic gates, a microprocessor, or other such supervisory system within the detector 79 to determine when to enable the operation of the processing portion 27.

Other implementations of the splatter control circuit are possible. For example, the output 167 of the DC amplifier 84 could be used to provide the AGC signal 68 applied to the RF amplifier 64 to reduce its gain in splatter situations to the point where blanking pulses are inhibited.

Figure 4:
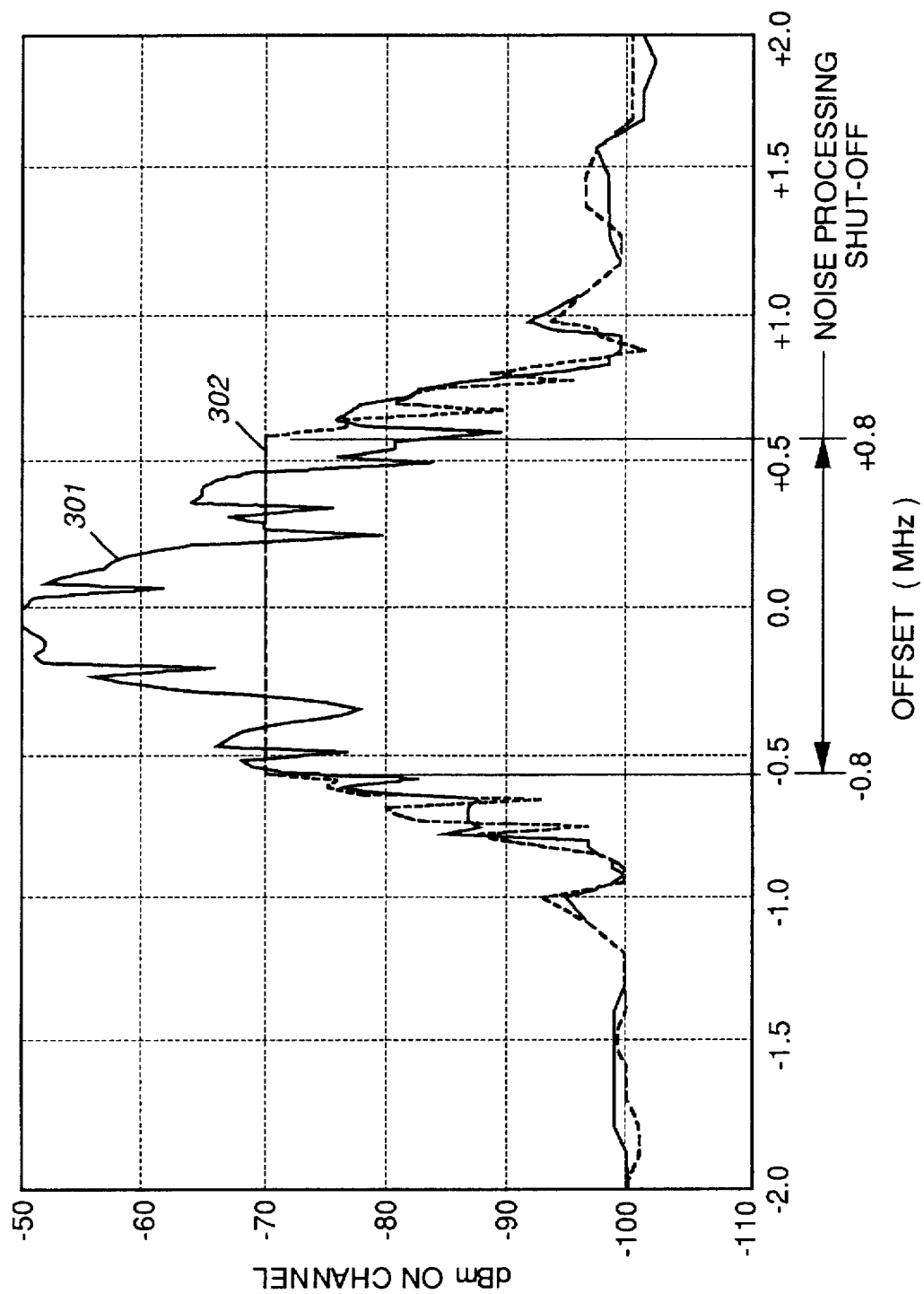
FIG. 4 is a graphical representation of the frequency response plots of the receiver of FIG. 2 compared with a receiver having a blanker without splatter control.

Referring to FIG. 4, the operation of the splatter control circuit 160 is shown. The frequency response graphs are a plot of the signal level in dBm (vertical axis) of the on-channel signal required to achieve an audio output quality of 12 dB sinad from the receiver speaker. The signal is modulated with a 1 KHz tone at 3 KHz deviation. The horizontal axis is the frequency offset from the on-channel signal of an interfering carrier with a level of −20 dBm. Pulses are also applied to the receiver input with a pulse width of 500 nanoseconds and a 1 KHz repetition rate. The three signal sources and the receiver are connected to a four-way resistive combiner pad which has 10 dB loss from input to output. Levels are at the generator outputs. With no noise blanker in the receiver 10, the graph of the on-channel signal follows the horizontal line labeled −70 dBm right across the page (not plotted).

The frequency response 301 of a conventional noise blanker with no splatter control circuit follows the solid line, giving the peak of −50 dBm close to the receiver channel. This frequency response shows that the receiver performance is actually worse with the noise blanker fitted due to the effects of splatter when the interfering signal is within 500 KHz of the on-channel signal. The noise blanker only improves receiver performance when the interfering signal is greater than 500 KHz away.

The frequency response of the noise blanker with the splatter control circuit 28 follows the dotted line 302, eliminating the peak between −70 and −50 dBm, and following approximately the conventional noise blanker curve below the −70 dBm line (within sinad measurement accuracy).

Figure 5:
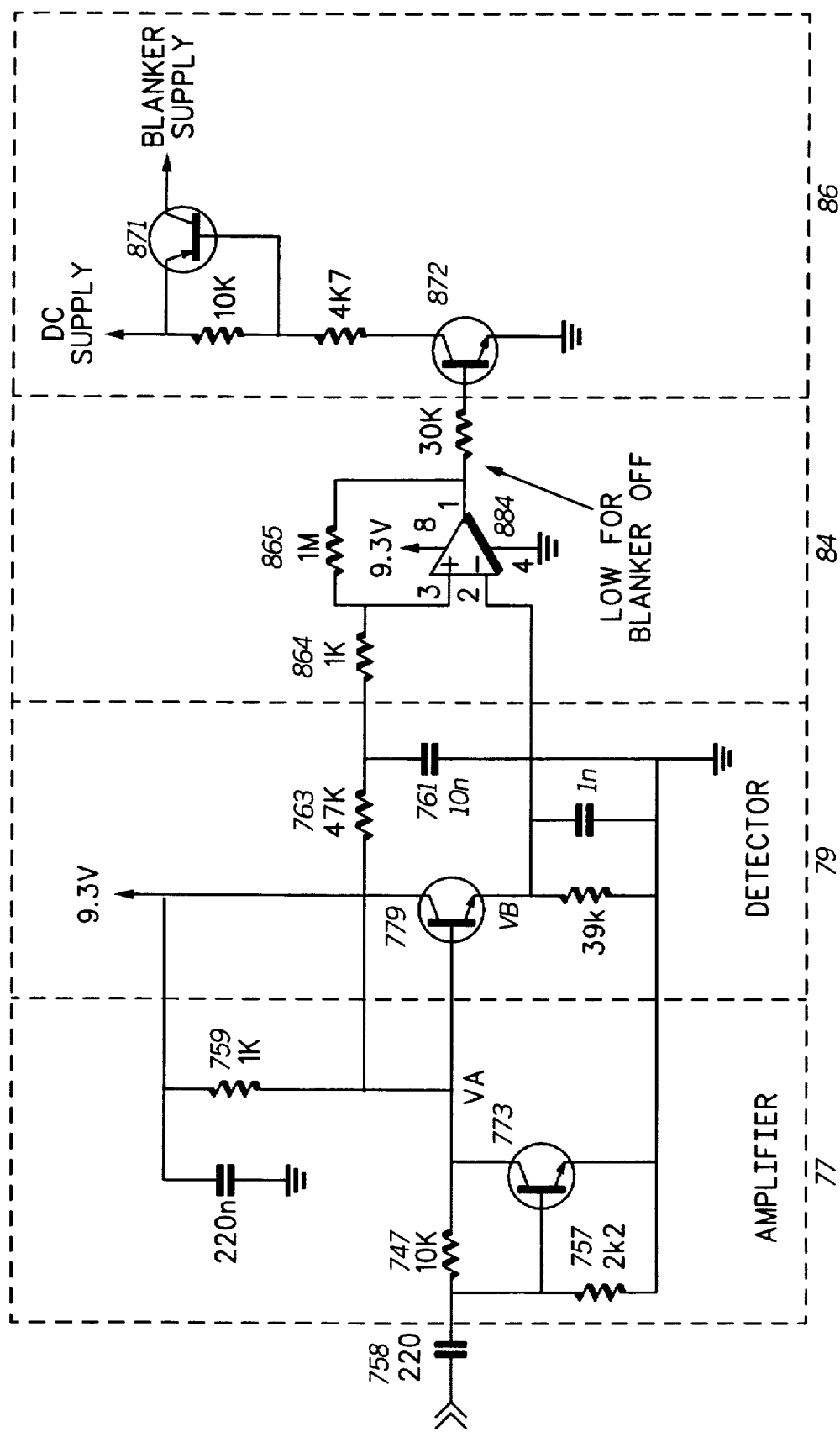
FIG. 5 is a schematic diagram of the splatter control circuit 160 of FIG. 2 in accordance with the present invention.

Referring to FIG. 5, the preferred embodiment of the splatter control circuit 160 of the noise blanker module 28 is depicted in schematic detail. The output of the IF amplifier 12 is coupled via a coupling capacitor 758 to the base input of a transistor amplifier 773. Since the main splatter problem occurs for unwanted signals of relatively great magnitude, the RF amplifier 77 does not require high gain and thus a single RF transistor in the form of a single 4882022N70 transistor (manufactured by Motorola) is adequate for use as this amplifier transistor. The amplifier circuit 77 is preferably configured as a common emitter amplifier with DC feedback consisting of a pair of biasing resistors 757 and 747 which sets the DC operating conditions. The collector signal output from the amplifier transistor 773 is developed across a collector load resistor 759, and is coupled to the base of a detector transistor 779 to form a DC collector input voltage VA.

The detector circuit 79 is known as an "infinite impedance" detector since the collector of the transistor 779 is grounded to AC signals and its emitter is bypassed to RF signals. When the signal level at the amplifier 12 collector output rises above the predetermined level, such as approximately −40 dBm, the DC level on the emitter VB of the detector transistor Q779 rises above the normal (no signal) DC level in proportion to the RF level. This is due to the rectifying action of the detector transistor 79. The DC component of the base voltage of the detector transistor 779 also falls as the input signal level rises, thereby creating a voltage difference between the base and emitter which provides a measure of the signal level at the SAW 40 output.

An operational amplifier (Op-Amp) 884, preferably implemented for the DC amplifier block 84 in FIG.2 as an MC33072 operational amplifier, is used to amplify this difference voltage to an appropriate level to drive the blanker supply switch 86. The Op-Amp 884 is configured as a high gain inverting amplifier with the gain set by a pair of biasing resistors 864 and 865. The inverting input of the Op-Amp 84 connects to the emitter output of the detector transistor 779. The DC level on the base of the detector transistor 779 is sampled via a sampling resistor 763 and the RF component is removed by a bypass capacitor 761, to provide a reference signal for the non-inverting input of the DC Op-Amp 884.

The RF gain of the amplifier 77 and the DC gain of the DC amplifier 84 are set such that the DC output of the Op-Amp 884 changes from high to low to turn the noise processing portion 27 of the blanker OFF, switching OFF the blanking pulses, and closing the IF signal path when a signal at the SAW output is of sufficient amplitude (the level where having the blanker ON would degrade the receiver recovered audio) to cause splatter. This switches OFF a driver transistor 872 and therefor a blanker supply switch transistor 871, which disables the blanker pulses.

In summary, a special circuit to automatically disable the noise blanker in the presence of splatter is advantageously used by the present invention to allow both a wide main receiver bandwidth and a narrow noise blanker bandwidth to coexist while effectively blanking noise from entering the IF with sufficient splatter control. This special circuit basically uses a SAW filtered IF output level detector to turn OFF the blanker when splatter occurs.

What is claimed is:

1. A splatter control circuit for a noise blanking receiver comprising:

a SAW filter having an input and an output, the SAW filter passing signals in a first predetermined band of a desired band;

a noise blanker for processing signals in a second band of the desired band, the noise blanker having a control input, a signal input connectable to the input of the SAW filter, and an output, the noise blanker producing at its output signals received in the first predetermined band when no noise pulses are detected in the second band;

a first blanker switch for blanking the SAW output when a noise pulse is detected in the second band;

a level detector having an input connected to the output of the SAW filter and an output, the level detector producing a signal at the output; and a second blanker switch for stopping the noise blanker from blanking at the control input when the SAW filter passes a signal above a predetermined level in response to the signal at the output of the level detector.

2. The splatter control circuit of claim 1, wherein the control input is an AGC input for the level detector to reduce the gain to the noise blanker at the AGC input when the SAW filter passes the signal above the predetermined level.

3. A splatter control circuit for a noise blanking receiver comprising;

a SAW filter having an input and an output, the SAW filter passing signals in a first predetermined band of a desired band;

a noise blanker for processing signals in a second band of the desired band, the noise blanker having a control input a signal input connectable to the input of the SAW filter, and an output, the noise blanker producing at its output signals received in the first predetermined band when no noise pulses are detected in the second band;

a blanker switch for blanking the SAW output when a noise pulse is detected in the second band; and a level detector having an input connected to the output of the SAW filter and an output, the level detector producing a signal at the output to stop the noise blanker from blanking at the control input when the SAW filter passes a signal above a predetermined level, wherein the control input of the noise blanker is a DC supply input for the level detector to switch OFF a DC supply to the noise blanker at the DC supply input when the SAW filter passes the signal above the predetermined level.

4. A wideband mobile receiver for recovering an information signal from a first intermediate (IF) signal, which includes means for blanking noise signals which may otherwise deteriorate performance, comprising:

means for branching the first IF signal into first and second input signals;

receiver means for recovering the information signal comprising:

a SAW filter for filtering and delaying the first intermediate signal to provide a delayed first intermediate signal;

a first blanker switch for operating on the delayed first intermediate signal to temporarily prevent recovery of the information signal in response to a control signal;

a noise blanker having a DC supply input, the noise blanker coupled to the receiver means for operating on the second input signal to provide the control signal;

means for deriving the delayed first intermediate signal into a third input signal;

a splatter control circuit having a second blanker switch coupled to the DC supply input of the noise blanker for automatically deactivating the noise blanker in response to the amplitude level of the delayed first intermediate signal.

5. The receiver of claim 4, wherein the splatter control circuit and the noise blanker are integrated as an optional removable plug-in module.

6. The receiver of claim 4, wherein the splatter control circuit comprises a radio frequency (RF) level detector.

7. The receiver of claim 6, wherein the RF level detector is configured as an infinite-impedance detector.

8. A wideband mobile receiver for recovering an information signal from a first intermediate (IF) signal, which includes means for blanking noise signals which may otherwise deteriorate performance, comprising:

means for branching the first IF signal into first and second input signals;

receiver means for recovering the information signal comprising:

a SAW filter for filtering and delaying the first intermediate signal to provide a delayed first intermediate signal;

a blanker switch for operating on the delayed first intermediate signal to temporarily prevent recovery of the information signal in response to a control signal;

a noise blanker having a DC supply input, the blanker coupled to the receiver means for operating on the second input signal to provide the control signal;

means for deriving the delayed first intermediate signal into a third input signal;

a splatter control circuit coupled to the DC supply input of the blanker for automatically deactivating the blanker in response to the amplitude level of the delayed first intermediate signal wherein the splatter control circuit comprises a radio frequency (RF) level detector having an input for receiving the delayed first intermediate signal from the SAW filter and having an output, the level detector producing a signal at the output to cut-off a DC supply at the DC supply input of the blanker when the SAW filter passes a signal above a predetermined level.

9. A receiver which includes means for blanking noise signals which may otherwise deteriorate performance, comprising:

a receiver front-end having an output for receiving at a desired band and for producing at its output an output signal representative of a signal received in the desired band;

a SAW filter having an input connectable to the output of the front-end and an output, the SAW filter passing signals in a first predetermined band of the desired band;

a noise processing filter having an input connectable to the output of the front-end and an output, the noise processing filter passing signals in a second band of the desired band;

a noise pulse detector having an input connectable to the output of the noise processing filter and an output;

a noise blanker switch having a DC supply input and a signal input connectable to the input of the SAW filter, an output and a control input connected to the output of the noise pulse detector, the blanker switch producing at its output signals received in the first predetermined band when no noise pulses are detected in the second band and the blanker switch blanking the SAW output when a noise pulse is detected in the second band; and a splatter control circuit comprising:

an amplifier having an input connected to the output of the SAW filter and an output; and a level detector having an input connected to the output of the amplifier and an output, the level detector producing a signal at its output to switch OFF the DC supply to the blanker switch at its DC supply input when the SAW filter passes a signal above a predetermined level.

10. The receiver of claim 9, wherein the level detector comprising:

an RF infinite-impedance detector having an input connected to the output of the amplifier and an output for providing a threshold signal for determining when the SAW filter passes the signal above the predetermined level;

a DC amplifier having an input connected to the output of the RF infinite-impedance detector and an output for amplifying the threshold signal to provide an amplified threshold signal; and a blanker supply switch having a DC supply input, a level input connected to the output of the DC amplifier, and an output for switching OFF the DC supply to the blanker switch at its DC supply input when the amplified threshold signal is above a predetermined DC level.

11. The receiver of claim 9, wherein the second band is a predetermined band approximately equal to the first band.

12. A mobile radio comprising:

a noise blanking receiver;

a controller controlling the receiver; and a splatter control circuit coupled to the noise blanking receiver comprising:

a SAW filter having an input and an output, the SAW filter passing signals in a first predetermined band of a desired band;

a noise blanker for processing signals in a second band of the desired band the noise blanker having a control input, a signal input connectable to the input of the SAW filter, and an output, the noise blanker producing at the output signals received in the first predetermined band when no noise pulses are detected in the second band;

a first blanker switch blanking the SAW output when a noise pulse is detected in the second band;

a level detector having an input connected to the output of the SAW filter and an output, the level detector producing a signal at the output; and a second blanker switch for stopping the noise blanker from blanking at the control input when the SAW filter passes a signal above a predetermined level in response to the signal at the output of the level detector.

* * * * *